United States Patent
Forbes et al.

(10) Patent No.: US 6,483,171 B1
(45) Date of Patent: Nov. 19, 2002

(54) VERTICAL SUB-MICRON CMOS TRANSISTORS ON (110), (111), (311), (511), AND HIGHER ORDER SURFACES OF BULK, SOI AND THIN FILM STRUCTURES AND METHOD OF FORMING SAME

(75) Inventors: Leonard Forbes, Corvallis, OR (US); Wendell P. Noble, Milton, VT (US); Alan R. Reinberg, Westport, CT (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/386,313

(22) Filed: Aug. 13, 1999

(51) Int. Cl.[7] ............................................. H01L 29/04
(52) U.S. Cl. ...................... 257/627; 257/351; 257/365; 257/368; 257/369; 257/627; 257/628
(58) Field of Search .................................. 257/351, 365, 257/368, 369, 627, 628

(56) References Cited

U.S. PATENT DOCUMENTS

| | | | |
|---|---|---|---|
| 3,603,848 A | * 9/1971 | Sato | 317/235 |
| 4,768,076 A | 8/1988 | Aoki et al. | 357/42 |
| 4,857,986 A | 8/1989 | Kinigawa | 357/42 |
| 5,616,935 A | * 4/1997 | Koyama et al. | 257/69 |
| 5,895,948 A | * 4/1999 | Mori et al. | 257/306 |
| 5,942,768 A | * 8/1999 | Zhang | 257/72 |
| 5,963,800 A | * 10/1999 | Augusto | 438/212 |
| 5,991,225 A | 11/1999 | Forbes et al. | 365/230.06 |
| 6,037,610 A | * 3/2000 | Zhang et al. | 257/64 |
| 6,307,214 B1 | * 10/2001 | Ohtani et al. | 257/59 |

OTHER PUBLICATIONS

Balk; "Orientation Dependence of Built–In Surface Charge on Thermally Oxidized Silicon"; Proceedings of the IEEE, vol. 53, p. 2133–34, 1965.
Carr et al.; "MOS/LSI Design and Applications"; McGraw–Hill Book Company, p. 37, 49–52, 1972.
Sato et al.; "Drift–Velocity Saturation of Holes in Si Inversion Layers"; J. Phys. Soc. Japan, vol. 31, p. 1346, 1971.
Sato et al.; "Mobility Anistropy of Electrons in Inversion Layers on Oxidized Silicon Surfaces"; Physical Review B, vol. 4, No. 6, Sep. 15, 1971; p. 1950–60.
Vitkavage et al.; "An investigation of Si–SiO2 interface charges in thermally oxidized (100), (110), (111), and (511) silicon"; J. Appl. Phys. vol. 68, No. 10, Nov. 15, 1990; p. 5262–72.

* cited by examiner

Primary Examiner—Jerome Jackson
Assistant Examiner—Edgardo Ortiz
(74) Attorney, Agent, or Firm—Dickstein Shapiro Morin & Oshinsky LLP

(57) ABSTRACT

A method for forming NMOS and PMOS transistors that includes cutting a substrate along a higher order orientation and fabricating deep sub-micron NMOS and PMOS transistors on the vertical surfaces thereof. The complementary NMOS and PMOS transistors form a CMOS transistor pair. The transistors are preferably used in structures such as memory circuits, e.g., DRAMs, which are, in turn, used in a processor-based system. Ideally, the deep sub-micron NMOS and PMOS transistors are operated in velocity saturation for optimal switching operation.

16 Claims, 6 Drawing Sheets

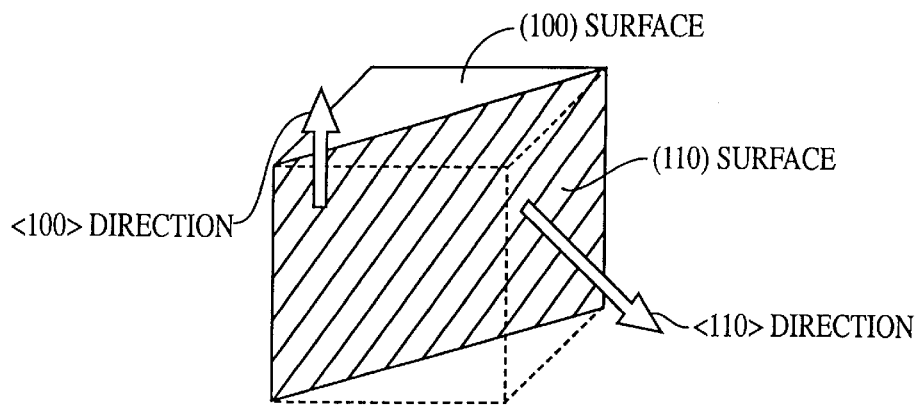
FIG. 1A
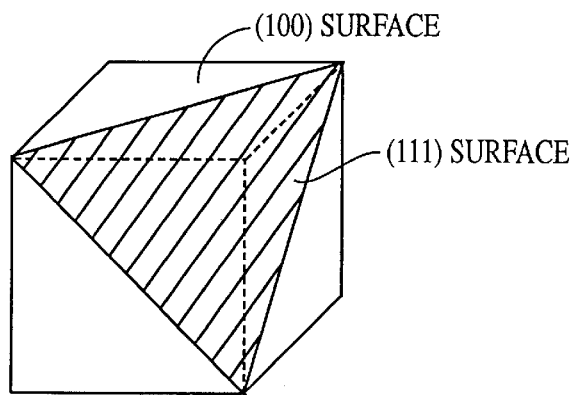
FIG. 1B
| SURFACE | Csi RELATIVE NUMBER OF ATOMS/UNIT AREA | TYPICAL SURFACE STATE DENSITIES OXIDE CHARGE | NORMAL REGION OF OPERATION SURFACE HOLE MOBILITY $\mu_p \frac{CM^2}{V \cdot SEC}$ |
|---|---|---|---|
| (100) | 2 | $9 \times 10^{10}$ | 100 |
| (110) | $2\sqrt{2}$ | $2 \times 10^{11}$ | 250 <110><br>170 <100> |
| (111) |  | $5 \times 10^{11}$ | 180 |
(OLD TECHNOLOGY NUMBERS ARE NOW LOWER)
FIG. 1C

VERTICAL SUB-MICRON CMOS TRANSISTORS ON (110), (111), (311), (511), AND HIGHER ORDER SURFACES OF BULK, SOI AND THIN FILM STRUCTURES AND METHOD OF FORMING SAME

CROSS REFERENCE TO RELATED APPLICATIONS

This application is related to application Ser. No. 09/386, 315 filed on even date herewith and entitled METHOD FOR FABRICATING CMOS TRANSISTORS HAVING MATCHING CHARACTERISTICS AND APPARATUS FORMED THEREBY, the contents of which are incorporated herein by reference.

BACKGROUND OF THE INVENTION

1. Field of the Invention

The present invention relates to a method of improving hole mobility and thus velocity saturating vertical transistors by forming the vertical transistors on crystal surfaces of higher order. Also, the present invention deals with the method of forming the vertical transistors and their use in memory cells.

2. Description of the Related Art

The nearly universal standard silicon wafer crystal orientation for VLSI ("Very Large Scale Integration") is the (100) orientation. This orientation was chosen over the previously used (111) orientation due to its low surface state density on thermally oxidized surfaces, $9 \times 10^{10}/cm^2$ versus $5 \times 10^{11}/cm^2$ as shown in FIG. 1C. FIGS. 1A and 1B simply illustrate conventional crystal orientations.

The difference between high and low surface state densities was originally a particularly important consideration for NMOS technology in that a high surface state density makes it difficult to control active and parasitic device threshold voltages as compared to low surface state densities. For the (110) surface orientation, the surface state charge density is $2 \times 10^{11}$ $e/cm^2$, which is about double that of the (110) orientation. In present day technology, however, this would amount to less than 0.10 V offset in active device threshold voltage and is readily compensated by the surface threshold voltage ion implant, body bias, and/or potentials of the backgates in SOI ("silicon-on-insulator") technology.

Even in the case of (111) surfaces, a very pessimistic estimate of the surface charge density of $5 \times 10^{11}/cm^2$ would result in a threshold voltage shift of only 0.25 V in present day technology. The original benefit to NMOS device was that the electron mobility in inversion layers is greater on the (110) surface than on other low order planes. However, it was pointed out in U.S. Pat. No. 4,857,986 to Kinugawa that for modern day CMOS technology with sub-micron devices, a different set of tradeoffs exist. In such short channel devices, the NFETS operate largely in velocity saturation resulting in a source to drain current that is independent of orientation. The PFETs, on the other hand, are less likely to be in velocity saturation and thus would benefit from optimizing the choice of crystal orientation around the inversion layer hole mobility.

Since the inversion layer hole mobility can be twice as high on the (110) surfaces than on the (110) surfaces, as is shown in FIG. 1C, which illustrates assorted properties of the various crystal orientations, overall circuit performance will be enhanced by basing the sub-micron CMOS technology on (110) oriented substrate wafers.

Both U.S. Pat. No. 4,857,986 to Kinugawa and U.S. Pat. No. 4,768,076 to Aoki et al. disclose planar bulk and SOI technologies that either use the (110) crystal wafer orientation or a recrystallized (110) surface layer. However, significant advantages have been obtained by using not just the (110) surface, which are not commonly available, but also (110), (111) and higher order surfaces on (110) and (111) orientation wafers, which are commonly available. FIG. 2 is a graph showing 70% to 80% higher hole mobility for conduction in the <100> directions on (110) surfaces and for conduction on (111) surfaces than on (100) surfaces.

Moreover, traditional thin film transistors as shown in FIG. 6A have an outward crystallization structure, which causes the current to flow across grain boundaries. This traditional horizontal transistor thus has a tendency to have low carrier mobilities.

Thus, the present invention seeks to achieve more uniform current flow as well as improve surface area utilization of the crystal surface.

SUMMARY OF THE INVENTION

The present invention seeks to mitigate the problems of the prior art by forming vertical transistors on higher order crystal orientations. The thus-formed vertical transistors have side gates, and may have back side gates, rather than a gate formed on top of the transistor, i.e. on the opposite side of the transistor from the substrate. The side gates and the back side gates facilitate current flow in the transistor.

The basic premise of the present invention is to increase the hole mobility in the transistors by forming the transistors on surfaces with higher order crystal orientations. By higher order, we mean surfaces which include the (110), (111), (311), and (511) surfaces as well as higher order surfaces. Such an increase in the hole mobility makes it more likely that the transistors, both NMOS and PMOS, are velocity saturated, thus making the transistors function better. Furthermore, the thus formed transistors are biased to operate in veolcity saturation. Moreover, this improvement in hole mobility is a direct result of forming the transistors on higher order crystal orientations.

The operation of the transistor is further enhanced by forming the transistors vertically, rather than horizontally. The vertical transistors allow for a shorter channel length, thus improving transistor operation. The thus formed transistors may be utilized in digital logic circuits, for example, in memory cells, such as DRAMs or SRAMs, among others.

BRIEF DESCRIPTION OF THE DRAWINGS

These and other objects, features and characteristics of the present invention will become apparent to one skilled in the art to which the present invention pertains by studying the following detailed description in conjunction with the appended drawings. In the drawings:

FIGS. 1A and 1B are illustrations showing assorted crystal surfaces and directions;

FIG. 1C is a table listing assorted properties of the surfaces pictured in FIG. 1;

DETAILED DESCRIPTION OF THE PRESENTLY PREFERRED EXEMPLARY EMBODIMENTS

Illustrative embodiments and exemplary applications will now be described with reference to the accompanying drawings. The present invention describes the use of vertical device structures to achieve the advantages noted above as well as further advantages of the present invention.

Figure 2:
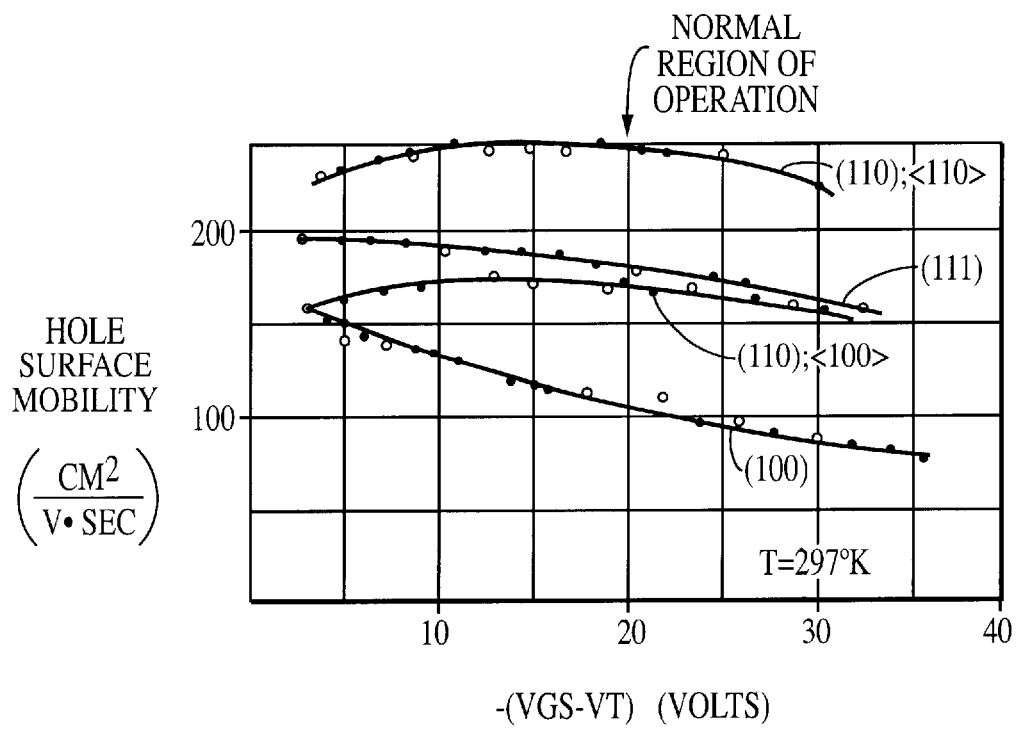
FIG. 2 is a graph depicting hole mobility on various surfaces as a function of voltage.
Figure 3:
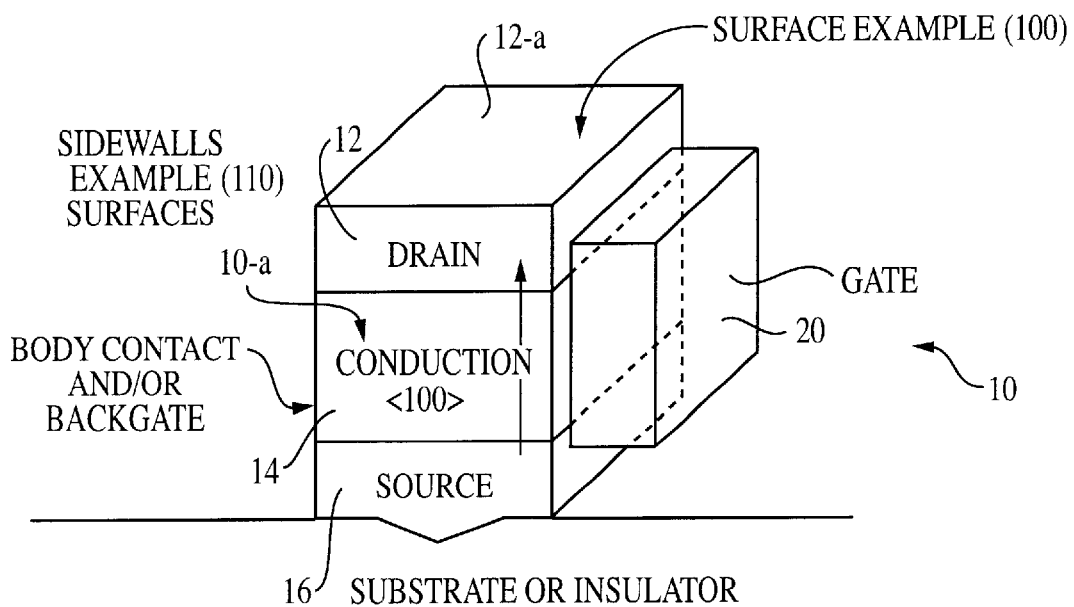
FIG. 3 illustrates an example of a vertical transistor according to a first embodiment of the present invention.

FIG. 3 illustrates an example of a vertical device 10, used in logic or memory applications. Vertical device 10 is formed on the sidewalls of intersecting trenches. As shown in FIG. 3, device 10 includes, from top to bottom, a drain 12, a conduction area 14, and a source 16, all of which are formed on a substrate or insulator 18. Gate 20 is formed on the side of the device 10. In the pictured example, the upper drain surface 12-a is formed on a (100) crystal orientation. As shown by the arrow, conduction occurs in the <100> direction, from the source to the drain. The sidewalls 10-a of the device 10 are in this example formed on a (110) crystal orientation. Such devices as that pictured at 10 in FIG. 3 have the features of SOI devices, and may be fabricated on conventional bulk wafers via a conventional process. Similar vertical devices have been proposed for electrically programmable devices and SRAMs. In the process sequence for each embodiment, the first mask defines a set of parallel stripes for etching trenches to define section areas upon which the devices will be built.

Figure 4A:
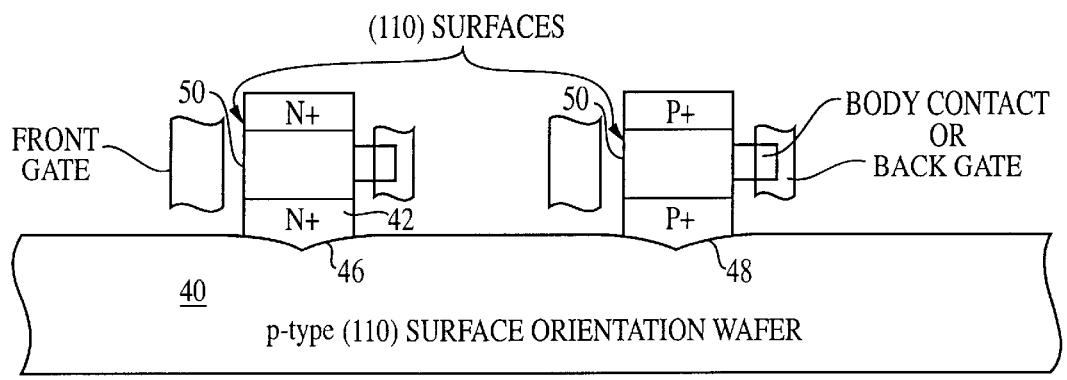
FIGS. 4A–4C illustrate embodiments of the present invention.
Figure 5:
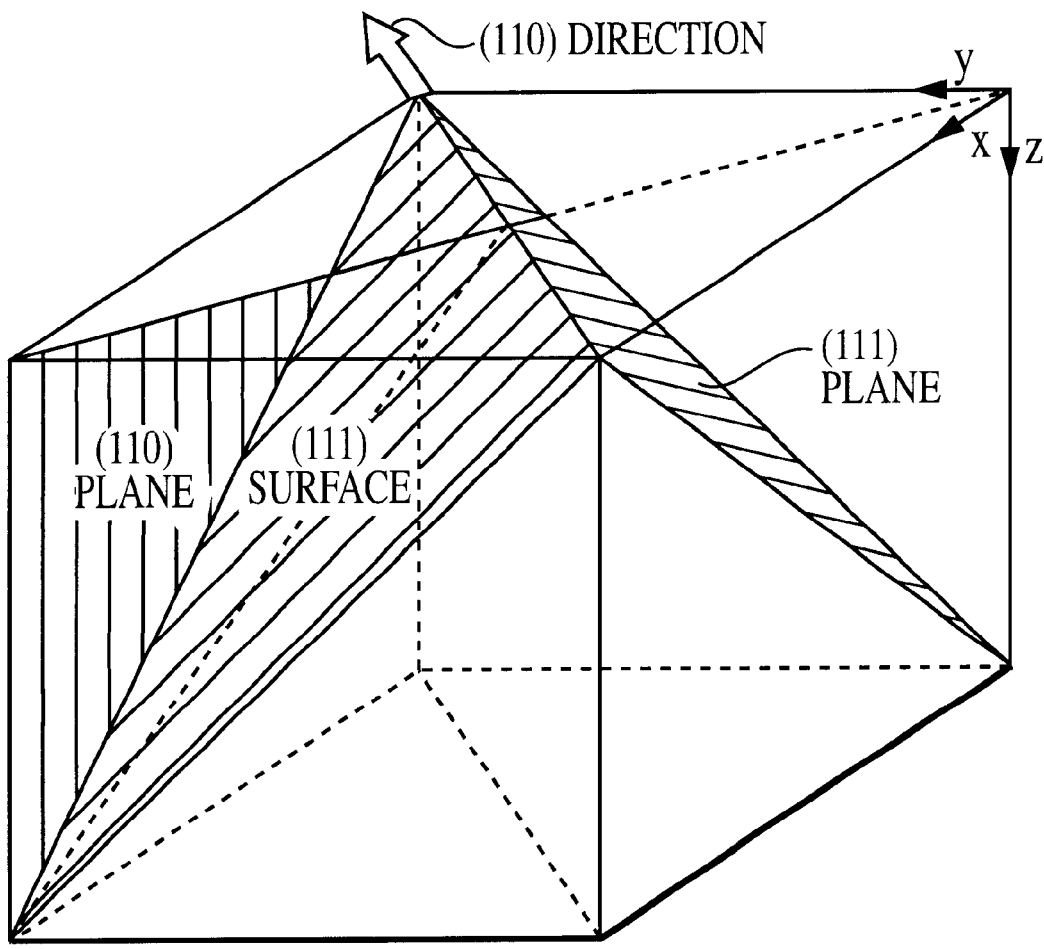
FIG. 5 illustrates a crystal and various planes therein.

As shown in FIG. 4A, if the starting wafer is a (100) orientation, for example, a p-type orientation wafer 40, and the first mask is oriented along the <110> direction, the trenches 46, 48, which are formed prior to the n-p-n structure is built vertically, will be the (110) planes. The process used, if followed to completion, will result in vertical NFET and PFET device having channels lying in the (110) plane with a current flow in the <100> direction. The vertical transistors each include a lower doped section 42, 44, which is either n+ or p+, with the lower doped sections 42, 44 being formed in trenches 46, 48 respectively. According to the data in FIG. 1C, the surface hole mobility of the room temperature PFET thus formed is 70% greater than that of the conventional planar device on the (100) plane. Also, the resultant device current is correspondingly higher. Because circuit performance is limited by PFET current, a corresponding performance improvement will occur. The enhanced performance will not be as great as if the device were formed such that channel conduction is in the <110> direction parallel to the wafer surfaces, but the vertical transistors are easier to fabricate and occupy less surface area and thus have a higher density of transistors. Vertical (110) surfaces 50 perpendicular to the wafer surface can also be formed by etching the (111) surface orientation wafers as illustrated in FIG. 5, the (110) and (111) surfaces being at 90 degrees to one another.

Figure 4B:
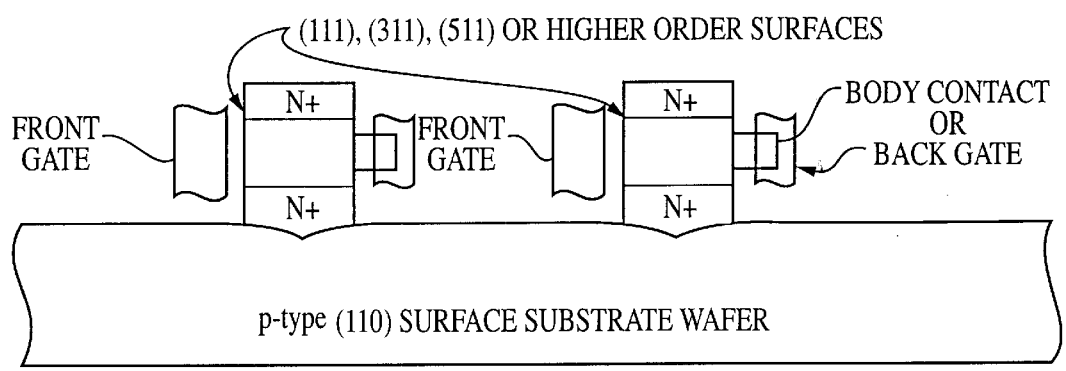

The surface mobility of holes is 80% higher on the (111) surfaces than on the (100) surfaces. For deep sub-micron, e.g., sized at about 0.5 microns or less, CMOS technology, (111) surfaces can also be used as illustrated in FIG. 4B, as can higher order surfaces such as (311), (511) and other higher order surfaces. Previously, (111) and higher order surfaces have not been widely utilized in CMOS technology, since the higher surface state charge density is detrimental to micron sized dimensional technology, but is irrelevant in deep submicron technology. Higher order surfaces can be used for deep sub-micron CMOS technology by etching (110) surface oriented wafers and forming vertical sidewalls. A wide variety of orientations can be formed depending upon the orientation of the mask used for etching. The thus formed transistors have substantially matching characteristics, such as the switching characteristics of the transistors and the current characteristics of the transistors.

If the mask used for etching is oriented in one of the equivalent <112> directions, then a vertical etch will produce (111) surfaces. FIG. 5 illustrates perpendicular (111) and (110) planes. However, as shown below, the dot product of two vectors (a, b, c) and (x, y, z) is ax+by+cz and if this sum is zero then the planes are perpendicular. It is well known that the (01$\bar{1}$) is equivalent to the (110) plane and thus, by taking the dot product of (311) and (01$\bar{1}$), (511) and (01$\bar{1}$), and (111) and (01$\bar{1}$), which is also known to be equivalent to the (110) plane, then the results show that the (311) and (511) planes are perpendicular to the (011) plane. The results also show that the (111) plane is perpendicular to the (110) plane in that all turn out to be have a zero sum vector dot product.

Figure 4C:
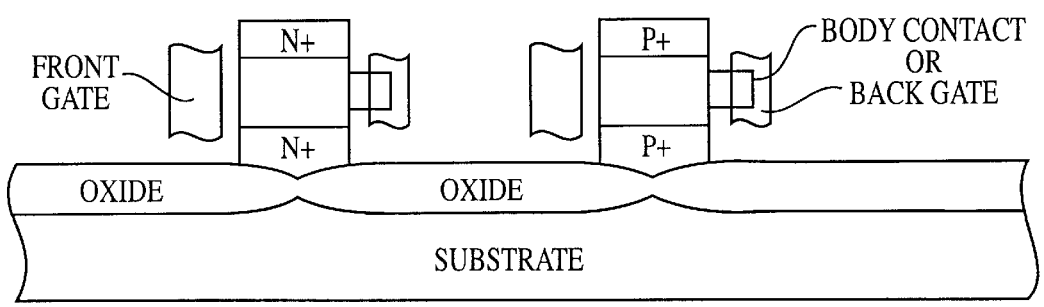

Other higher order surfaces such as the (311) surface and the (511) surface can be produced by rotation of the etch mask. As shown in FIG. 4B, these planes, i.e. the (311) and (511) surfaces, can be perpendicular to the (110) surface. The characteristics of the (311) surface have been previously investigated for use in MOS technology, and the (511) surfaces have some unique properties and can have a very low surface state density. Transistors can be formed in bulk along these sidewalls as shown in FIGS. 4A and 4B, as well as in SOI technology as shown in FIG. 4C.

Figure 6A:
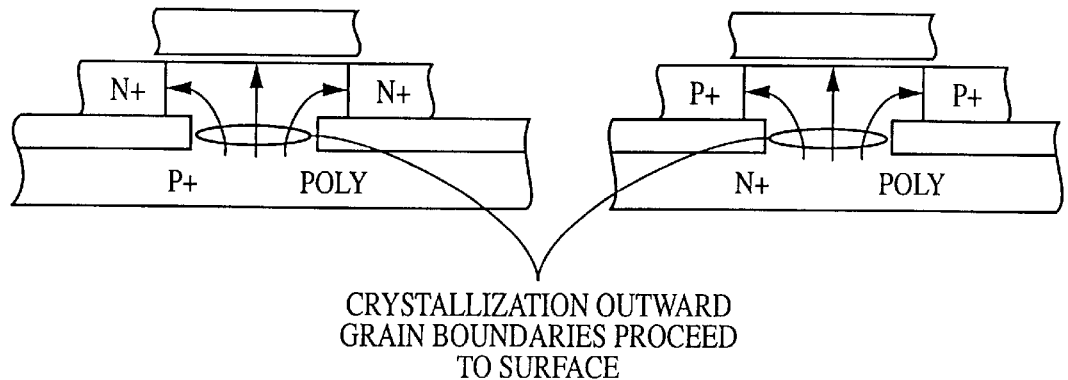
FIG. 6A depicts the recrystallization of thin films a prior art horizontal transistor.
Figure 6B:
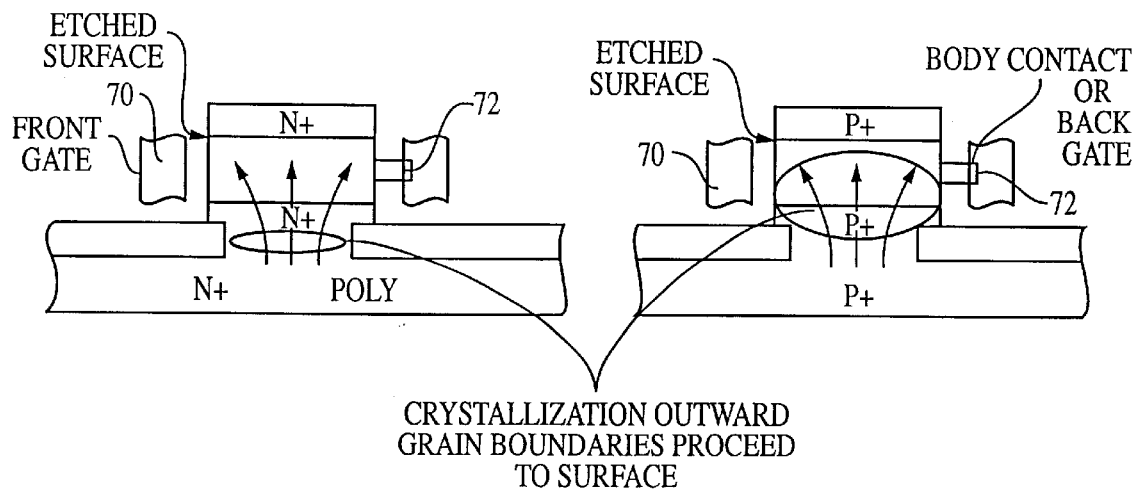
FIG. 6B depicts vertical transistors according to the present invention.

FIG. 6B illustrates a vertical transistor formed in thin film transistor technology and the current flow therein. The vertical transistor has a front gate 70 and may have a back gate 72. The front gate 70 and the back gate 72 allow the current to flow vertically from source to drain rather than across grain boundaries as in the horizontal transistors of FIG. 6A. A body contact may be used rather than a back gate.

Figure 7:
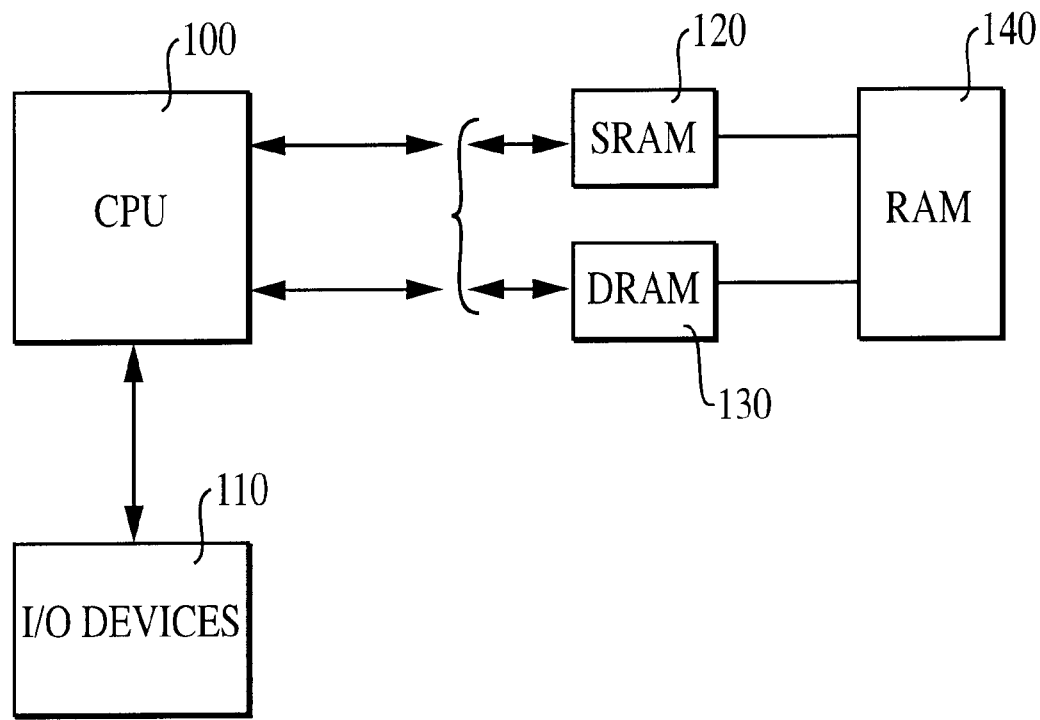
FIG. 7 shows a schematic diagram of a processing system including a DRAM or an SRAM, or both, having CMOS transistors fabricated according to the present invention.

FIG. 7 illustrates a processor-based system including a CPU 100, input/out devices 110, either SRAM unit 120 or DRAM unit 130, either of which functions as a memory device, and a storage device such as a RAM 140. The DRAM 130 or the SRAM 120 include peripheral circuits having NMOS and PMOS transistors fabricated in accordance with the method of the present invention. The NMOS DRAM or SRAM transistors are as pictured in FIGS. 4A and 4C, as are the PMOS transistors, which differ from the NMOS transistors by switching the n type semiconductor material for p type semiconductor material. The transistors of the DRAM or SRAM are formed on the (111), (311), (511) or higher order crystal surfaces of the silicon substrate. The RAM 140 is connected to the NMOS/PMOS DRAM or SRAM transistor pair.

While the present invention is described herein with reference to illustrative embodiments for particular applications, it should be understood that the invention is not limited thereto. Those having ordinary skill in the art and access to the teachings provided herein will recognize additional modifications, applications, embodiments and substitution of equivalents all fall within the scope of the invention. Accordingly, the invention is not to be considered as limited by the foregoing description, but instead is limited by the scope of the appended claims.

What is claimed is:

1. An integrated circuit structure, comprising:
   a silicon substrate having a higher order crystal plane; and
   NMOS and PMOS transistors formed vertically on said higher order crystal plane of said silicon substrate, wherein each of said NMOS and PMOS transistors have at least two active regions that are aligned vertically to one another and with respect to said silicon substrate and are separated from each other by a conduction region;
   each said conduction region of said NMOS and PMOS transistors comprise channels lying vertically in the (110) plane or higher.

2. An integrated circuit structure as in claim 1, wherein said higher order crystal plane is selected from the group consisting of (111), (311), and (511) crystal planes.

3. A processor-based system comprising:
   a processor;
   a memory device coupled to said processor, said memory device comprising at least one memory circuit, said memory circuit comprising:
   a substrate having a higher order crystal orientation; and
   at least one pair of vertical NMOS and PMOS transistors formed as a CMOS transistor pair fabricated on said higher order crystal orientation, wherein each of said vertical NMOS and PMOS transistors comprise at least two active areas separated by a channel region, said active areas and channel region being in a vertical column in relation to said substrate for each said transistor and said channel region lying vertically in the (110) plane or higher; and
   a storage device coupled to said CMOS transistor pair.

4. A processor-based system as in claim 3, wherein said memory device is a one of an SRAM and a DRAM.

5. A processor-based system as in claim 3, wherein said processor-based system is a computer system.

6. A method of operating a CMOS circuit comprising:
   providing an integrated circuit having PMOS and NMOS transistors fabricated vertically in a higher order surface of a silicon wafer;
   each of said PMOS and NMOS transistors comprising source and drain regions so that the source of each said transistors is aligned vertically with respect to the drain of the same transistor and is separated from said drain of the transistor by a conduction area, said conduction are having a channel region with sidewalls in the (110) plane or higher; and
   biasing said transistors to operate in velocity saturation.

7. A method of operating a CMOS circuit as in claim 6, wherein said higher order surface is one of the (111), (311), (511) or yet higher order surfaces.

8. A memory circuit comprising:
   at least one pair of vertical NMOS and PMOS transistors formed as a CMOS transistor pair on a higher order surface of a silicon substrate with source and drain regions of each of said transistors aligned vertically relative to each other and each of said transistors having a channel region with sidewalls in the (110) plane or higher, wherein said at least one pair of transistors is in electrical connection with at least one memory cell.

9. A memory circuit as in claim 8, wherein said higher order surface is one of the (111), (311), (511) or yet higher order surfaces.

10. A memory circuit as in claim 8, wherein said NMOS and PMOS transistors have matching characteristics.

11. A memory circuit as in claim 9, wherein said memory circuit is a DRAM memory circuit.

12. A memory circuit as in claim 9, wherein said memory circuit is an SRAM memory circuit.

13. A processor-based system comprising:
   a processor;
   a memory device coupled to said processor, said memory device comprising at least one memory circuit, said memory circuit comprising:
   a substrate having a higher order crystal orientation; and
   at least one pair of vertical NMOS and PMOS transistors formed as a CMOS transistor pair fabricated on said higher order crystal orientation, said vertical NMOS and PMOS transistors each comprising at least three vertically oriented layers, two being active areas separated by the third layer being a conductive layer, wherein said at least three layers have vertical sidewalls in the plane of (110) crystal orientation or higher; and
   a storage device coupled to said CMOS transistor pair.

14. A processor-based system as in claim 13, wherein said higher order crystal orientation is selected from the group consisting of (111), (311), (511) and still higher order surface orientations.

15. A processor-based system as in claim 14, wherein said memory device is one of a DRAM and an SRAM.

16. A processor-based system as in claim 15, wherein said processor-based system is a computer system.

* * * * *

UNITED STATES PATENT AND TRADEMARK OFFICE
CERTIFICATE OF CORRECTION

PATENT NO.    : 6,483,171 B1
DATED         : November 19, 2002
INVENTOR(S)   : Leonard Forbes et al.

It is certified that error appears in the above-identified patent and that said Letters Patent is hereby corrected as shown below:

Column 1,
Lines 50 and 61, "(110)" should read -- (100) --

Column 2,
Line 5, "(110)" should read -- (100) --

Column 5,
Line 48, "are" should read -- area --

Signed and Sealed this

Twenty-second Day of July, 2003

JAMES E. ROGAN
*Director of the United States Patent and Trademark Office*